United States Patent [19]
McClure

[11] Patent Number: 5,828,622
[45] Date of Patent: Oct. 27, 1998

[54] CLOCKED SENSE AMPLIFIER WITH WORDLINE TRACKING

[75] Inventor: David C. McClure, Carrollton, Tex.

[73] Assignee: STMicroelectronics, Inc., Carrollton, Tex.

[21] Appl. No.: 944,649

[22] Filed: Oct. 6, 1997

Related U.S. Application Data

[62] Division of Ser. No. 587,728, Jan. 19, 1996.

[51] Int. Cl.⁶ .................................................... G11C 7/00
[52] U.S. Cl. ............... 365/230.03; 365/194; 365/230.06; 365/205; 365/233
[58] Field of Search ........................ 365/230.01, 189.01, 365/230.03, 194, 230.06, 205, 233

[56] References Cited

U.S. PATENT DOCUMENTS

| | | | |
|---|---|---|---|
| 4,425,633 | 1/1984 | Swain | 365/194 |
| 4,485,430 | 11/1984 | McClure | 365/203 |
| 4,644,196 | 2/1987 | Flannagan | 365/227 |
| 4,807,191 | 2/1989 | Flannagan | 365/189 |
| 4,962,324 | 10/1990 | Park | 365/203 |
| 5,072,138 | 12/1991 | Slemmer et al. | 307/465 |
| 5,126,970 | 6/1992 | UI Haq | 365/154 |
| 5,161,159 | 11/1992 | McClure et al. | 371/22.1 |
| 5,265,100 | 11/1993 | McClure et al. | 371/21.2 |
| 5,267,210 | 11/1993 | McClure et al. | 365/218 |
| 5,305,268 | 4/1994 | McClure | 365/203 |
| 5,311,467 | 5/1994 | Lysinger et al. | 365/189.01 |
| 5,311,473 | 5/1994 | McClure et al. | 365/201 |
| 5,339,277 | 8/1994 | McClure | 365/230.08 |
| 5,341,336 | 8/1994 | McClure | 365/201 |
| 5,349,243 | 9/1994 | McClure | 307/272.1 |
| 5,357,468 | 10/1994 | Satani et al. | 365/203 |
| 5,369,619 | 11/1994 | Ohba | 365/230.03 |
| 5,396,108 | 3/1995 | McClure | 327/108 |
| 5,402,379 | 3/1995 | McClure | 365/203 |
| 5,404,334 | 4/1995 | Pascucci et al. | 365/210 |
| 5,408,435 | 4/1995 | McClure et al. | 365/201 |
| 5,422,839 | 6/1995 | Ishibashi et al. | 365/51 |
| 5,424,985 | 6/1995 | McClure et al. | 365/194 |
| 5,444,662 | 8/1995 | Tanaka et al. | 365/203 |
| 5,450,019 | 9/1995 | McClure et al. | 326/28 |
| 5,455,798 | 10/1995 | McClure | 365/200 |
| 5,455,802 | 10/1995 | McClure | 365/233 |
| 5,473,567 | 12/1995 | McClure | 365/208 |
| 5,519,650 | 5/1996 | Ichimura et al. | 365/63 |
| 5,554,874 | 9/1996 | Doluca | 257/390 |
| 5,570,319 | 10/1996 | Santoro et al. | 365/230.03 |
| 5,666,324 | 9/1997 | Kosugi et al. | 365/233 |
| 5,691,950 | 11/1997 | McClure | 365/230.03 |
| 5,717,645 | 2/1998 | Kengeri et al. | 365/230.01 |

*Primary Examiner*—Viet Q. Nguyen
*Attorney, Agent, or Firm*—Theodore E. Galanthay; Lisa K. Jorgenson

[57] ABSTRACT

A memory device with a sense amplifier enable line having the same resistance and capacitance as a local wordline. The sense amplifier enable line is made out of the same material, has the same layout, and has the same load placed on as a local wordline, this will make the sense amplifier enable line have the same resistance, capacitance, and load characteristics as a local wordline. The load on the sense amplifier enable line is a combination of the sense amplifier enable line operational circuitry and sense amplifier enable line load circuit.

12 Claims, 5 Drawing Sheets

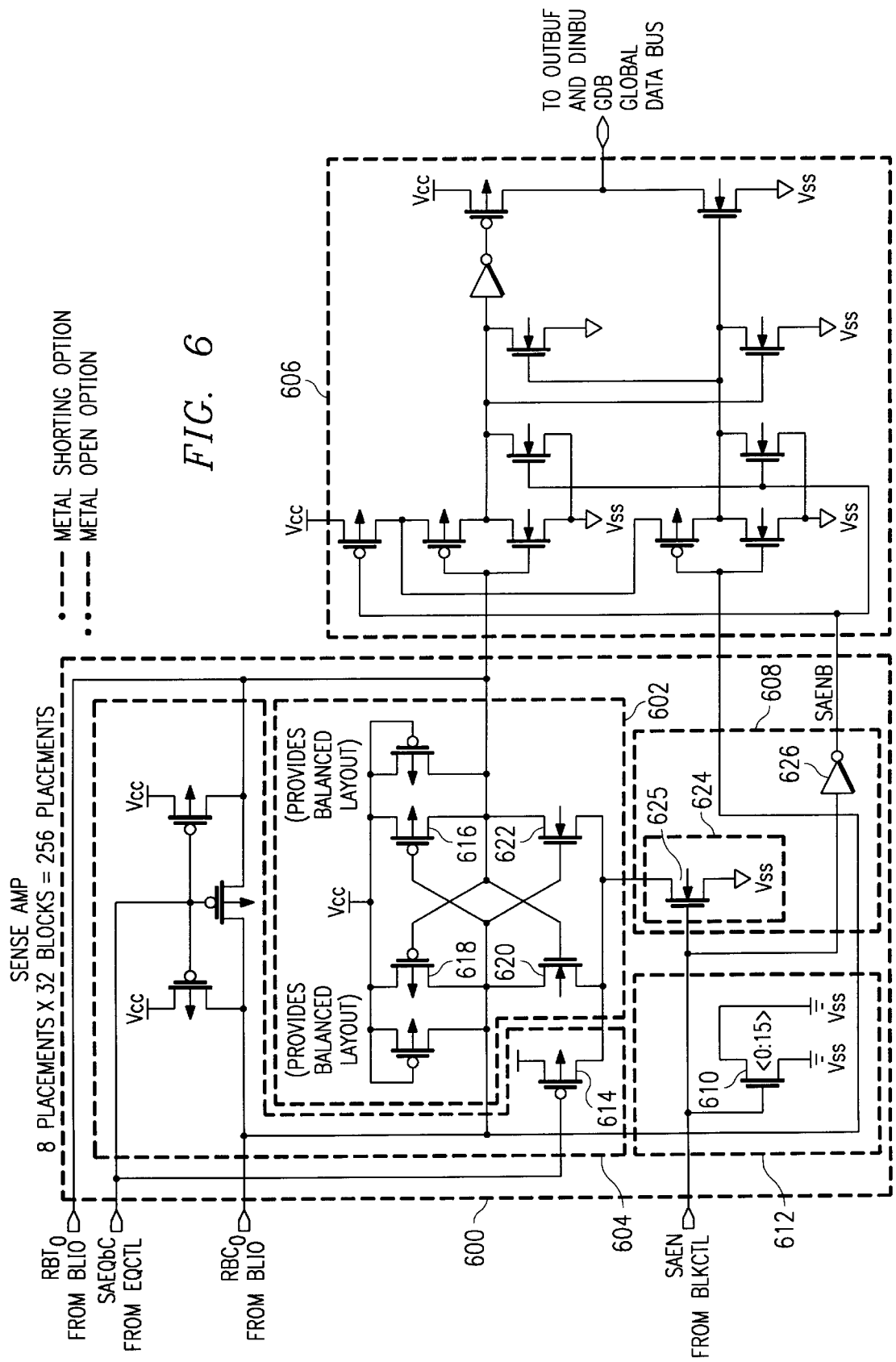

CLOCKED SENSE AMPLIFIER WITH WORDLINE TRACKING

This is a division of application Ser. No. 08/587,728, filed Jan. 19, 1996.

CROSS-REFERENCE TO RELATED APPLICATIONS

The following pending U.S. Patent Applications by David C. McClure entitled: "Architecture Redundancy," Ser. No. 08/582,424, and "Redundancy Control," Ser. No. 08/580,827, which were filed Dec. 29, 1995, and have the same ownership as the present application, and to that extent are related to the present application, which are incorporated herein by reference; and entitled: "Test Mode Activation and Data Override," Ser. No. 08/587,709, "Pipelined Chip Enable Control Circuitry and Methodology," Ser. No. 08/588,730, "Output Driver Circuitry Having a Single Slew Rate Resistor," Ser. No. 08/588,988, "Synchronous Stress Test Control," Ser. No. 08/589,015, "Write Pass Through Circuit," Ser. No. 08/588,662, "Data-Input Device for Generating Test Signals on Bit and Bit-Complement Lines," Ser. No. 08/588,762, "Synchronous Output Circuit," Ser. No. 08/588,901, "Write Driver Having a Test Function," Ser. No. 08/589,141, "Circuit and Method for Tracking the Start of a Write to a Memory Cell," Ser. No. 08/589,139, "Circuit and Method for Terminating a Write to a Memory Cell," Ser. No. 08/588,737, "Memory-Row Selector Having a Test Function," Ser. No. 08/589,140, "Synchronous Test Mode Initialization," Ser. No. 08/588,729, "Device and Method for Isolating Bit Lines from a Data Line," Ser. No. 08/588,740, "Circuit and Method for Setting the Time Duration of a Write to a Memory Cell," Ser. No. 08/587,711, "Low-Power Read Circuit and Method for Controlling a Sense Amplifier," Ser. No. 08/589,024, "Device and Method for Driving a Conductive Path With a Signal," Ser. No. 08/587,708, and "Burst Counter Circuit and Method of Operation Thereof," Ser. No. 08/589,023, all of which have the same effective filing date and ownership as the present application, and to that extent are related to the present application, which are incorporated herein by reference.

BACKGROUND AND SUMMARY OF THE INVENTION

The present invention relates to the field of semiconductor memories, and is more specifically directed to sensing signals from a memory array.

Sense amplifiers are used to detect signals from a memory array during a read. The sense amplifiers are typically associated with a group of memory cells that are accessed through a local wordline. When a memory cell is accessed the wordline driver associated with the row in which the memory cell is located generates a signal that travels across the local wordline to the appropriate memory cell.

As the signal travels across the local wordline there is a delay between each successive memory cell. This can cause a conspicuous delay between the memory cells reached first and the one reached last. This has caused significant problems in the prior art in enabling the sense amplifier.

The sense amplifier is enabled by generating a signal on the sense amplifier enable line. The signal on the sense amplifier enable line travels faster than the signal on the local wordline. If the signal on the sense amplifier enable line is generated at the same time as the signal on the local wordline the sense amplifier associated with the memory cells reached last by the local wordline will be enabled before the memory cell will be accessed. Erroneous data will be read. If the data on the data bus is not the same as the data in the memory cell being accessed the wrong data will be produced at the output of the memory device, an unacceptable occurrence.

One way of solving this problem is to delay the signal on the sense amplifier enable line such that the sense amplifier associated with the last memory cell that is reached by the local wordline is enabled when the last memory cell is accessed. However, if the first memory cell that is reached by the local wordline is being accessed, the memory cell will be accessed and the data will sit on the read bus for some time before the sense amplifier associated with it is enabled. This makes the read cycle time of the memory device always based on the time it takes to access the memory cell last reached, regardless of which memory cell is actually being accessed. This decreases the total speed of the memory device. Increasing the speed semiconductor circuits, particularly of the memory devices has long been a fundamental goal in the semiconductor industry. Therefore, by decreasing the speed of the memory device the memory device is made less competitive. This also does not track process variations, so with a different process the delay originally set may not ensure that the sense amplifier associated with last memory cell that is reached by the local wordline is enabled when the last memory cell is accessed.

Further background on memories can be found in: Prince, Betty, SEMICONDUCTOR MEMORIES, A HANDBOOK OF DESIGN, MANUFACTURE, AND APPLICATION, $2^{nd}$ ed., John Wiley & Sons, 1991; ISSCC proceedings from 1975 to the present, all incorporated herein by reference.

SUMMARY OF THE INVENTION

An integrated circuit memory structure is disclosed were the sense amplifier associated with a memory cell is enabled at the same time the memory cell is accessed. This is done by making sure the sense amplifier enable line has the same resistance and capacitance as a local wordline. If the resistance and capacitance, and the general construction of the two lines is the same, the delay time between a first signal, generated by the wordline drivers, and a second signal, generated by the sense amplifier driver, will be the same as the delay time the first signal accessing a memory cell and the second signal enabling the sense amplifier associated with that memory cell, regardless of their position with respect to the sense amplifier driver. In the present invention the sense amplifier enable line is made out of the same material, has the same layout, and has the same load placed on it as a local wordline. This will make the sense amplifier enable line have the same resistance and capacitance, and the same delay characteristics as a local wordline. The load on the sense amplifier enable line is a combination of the sense amplifier enable line operational circuitry and sense amplifier enable line load circuit.

An advantage of the present invention is that it allows each sense amplifier to be enabled after the same particular delay that the memory cell with which they are associated with is accessed.

Another advantage of this invention is that it allows the sense amplifier to receive the full signal of the read bus, ensuring data from the read bus is transferred to the global read bus successfully.

A further advantage of the current invention is that it ensures that all of the sense amplifiers are enabled only after the memory cell with which they are associated with is accessed when the process by which the memory device made is changed.

Another advantage of the this invention is that the delay characteristics of the local wordlines can be replicated using little additional area.

A particularly advantageous use of the current invention is in memory devices with a large number of columns.

Other advantages and objects of the invention will be apparent to those of ordinary skill in the art having reference to the following specification together with the drawings.

BRIEF DESCRIPTION OF THE DRAWINGS

FIG. 6 is an electrical diagram, in schematic form, of a read circuit having a sense amplifier.

DETAILED DESCRIPTION OF THE PREFERRED EMBODIMENT

Figure 1A:
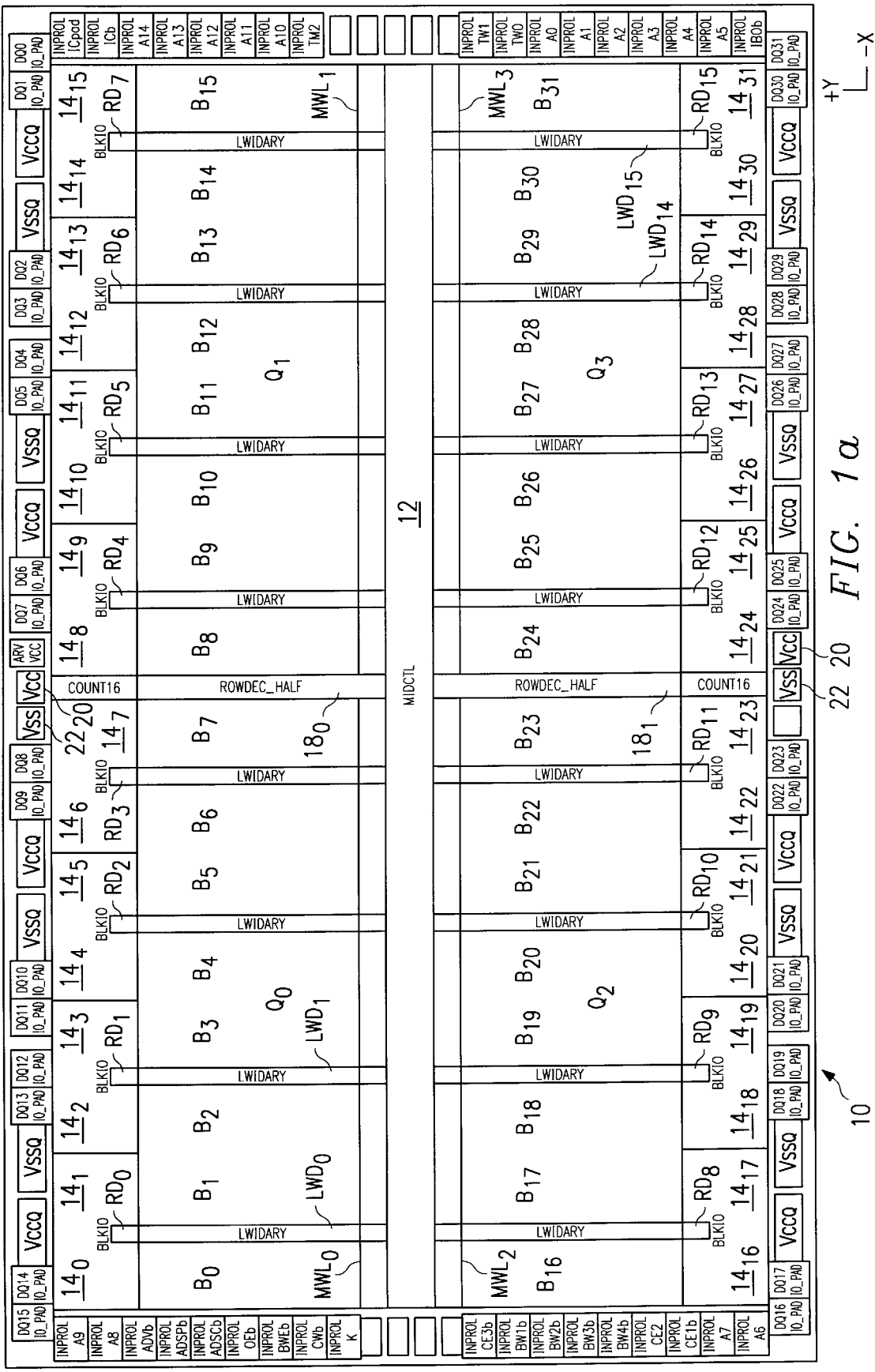
FIG. 1a is an electrical diagram, in block form, of an integrated circuit memory device.
Figure 1B:
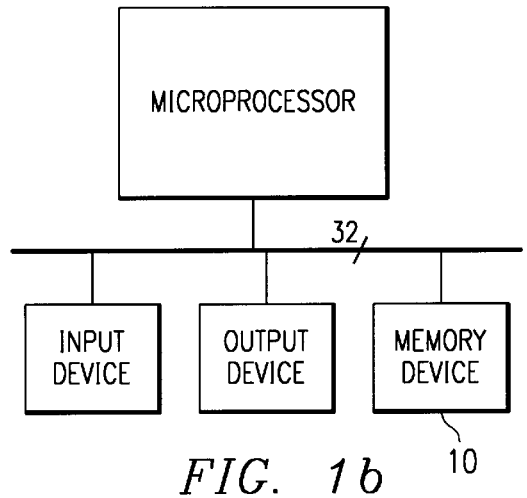
FIG. 1b is an electrical diagram, is block form, of a computer containing the integrated circuit memory device.

FIG. 1a shows a memory 10 that can be used in a computer shown in FIG. 1b. The preferred embodiment of the invention can be incorporated into the memory shown in FIG. 1a. In this example, memory 10 is a 32K×32 Burst Static Random Access Memory (Burst SRAM). The memory can have its memory cells in a single block or in multi blocks. In the preferred embodiment of the invention the memory device 10 has an even number of blocks. In the present example thirty-two blocks $B_0, \ldots B_{31}$ are shown.

The blocks $B_0, \ldots B_{31}$ are divided into 4 quadrants $Q_0, Q_1, Q_2, Q_3$ of 8 blocks each. A master wordline decoder 12 runs through the center of the memory device 10. Master wordlines $MWL_0, MWL_1, MWL_2, MWL_3$ run through each quadrant. Local wordline decoders $LWD_0, \ldots LWD_{15}$ are located between each of pair of blocks, and bitlines (true and complement) $BT_0, \ldots BT_{31}$ and $BC_0, \ldots BC_{31}$ run through each quadrant. There is one local wordline for each row. In the example shown in FIG. 1a, there are 256 local wordline running through each block $LWL_00 \ldots LWL_0255 \ldots LWL_{31}0 \ldots LWL_{31}255$, and 256 bitlines (256 true and 256 complement) running through each block $BT_00 \ldots BT_0255 \ldots BT_{31}0 \ldots BT_{31}255$ and $BC_00 \ldots BC_0255 \ldots BC_{31}0 \ldots BC_{31}255$.

Block input/output circuitry $14_0 \ldots 14_{31}$ is associated with each block. Input/output buffers, redundant decoders, and row and address decoders are located in the block input/output circuitry $14_0 \ldots 14_{31}$, between the block input/output circuitry or in the central regions 12, $18_0$, $18_1$ of the memory device 10. Redundant columns can be located in each block, in the preferred embodiment two redundant columns are located in each block. In the preferred embodiment, the memory device 10 can receive 32 bits of data simultaneously or output 32 bits of data simultaneously. This can be achieved by simultaneously accessing 8 memory cells in each of four block, or by accessing one memory cell in each of the 32 blocks $B_0, \ldots B_{31}$. Bonding pads are provided for connecting to the input/output pins DQ0 . . . DQ31, as well as voltage supply lines, address lines A0 . . . A14, and other electrical connections.

Power supply terminals are connected to the voltage supply lines. Power supply terminals 22 and $V_{SSQ}$ are connected to the ground voltage, $V_{SS}$, and power supply terminals 20 and $V_{CCQ}$ are connected to the power-supply voltage, $V_{CC}$. The input/output pins DQ0 . . . DQ31 are coupled to the master word lines $MWL_0 \ldots MWL_3$. The master wordlines $MWL_0 \ldots MWL_3$ are connected to the wordline drivers $WD_00 \ldots WD_{31}255$ (shown in FIG. 2) in the local wordline decoders $LWD_0 \ldots LWD_{15}$. There is one wordline driver for each local wordline in each block, making a total of 512 wordline drivers in each local wordline decoder. The local wordlines are connected through the wordline drivers to the memory cells. This allows the data on the input/output pins DQ0 . . . DQ31 to be written to the memory cells.

The memory cells in memory device 10 are grouped into rows and columns. In this example, as is conventional, a row refers to the array direction in which a plurality of memory cells are selected by way of a word line. A column refers to the array direction in which memory cells in the selected row are selected for reading or writing.

Figure 2:
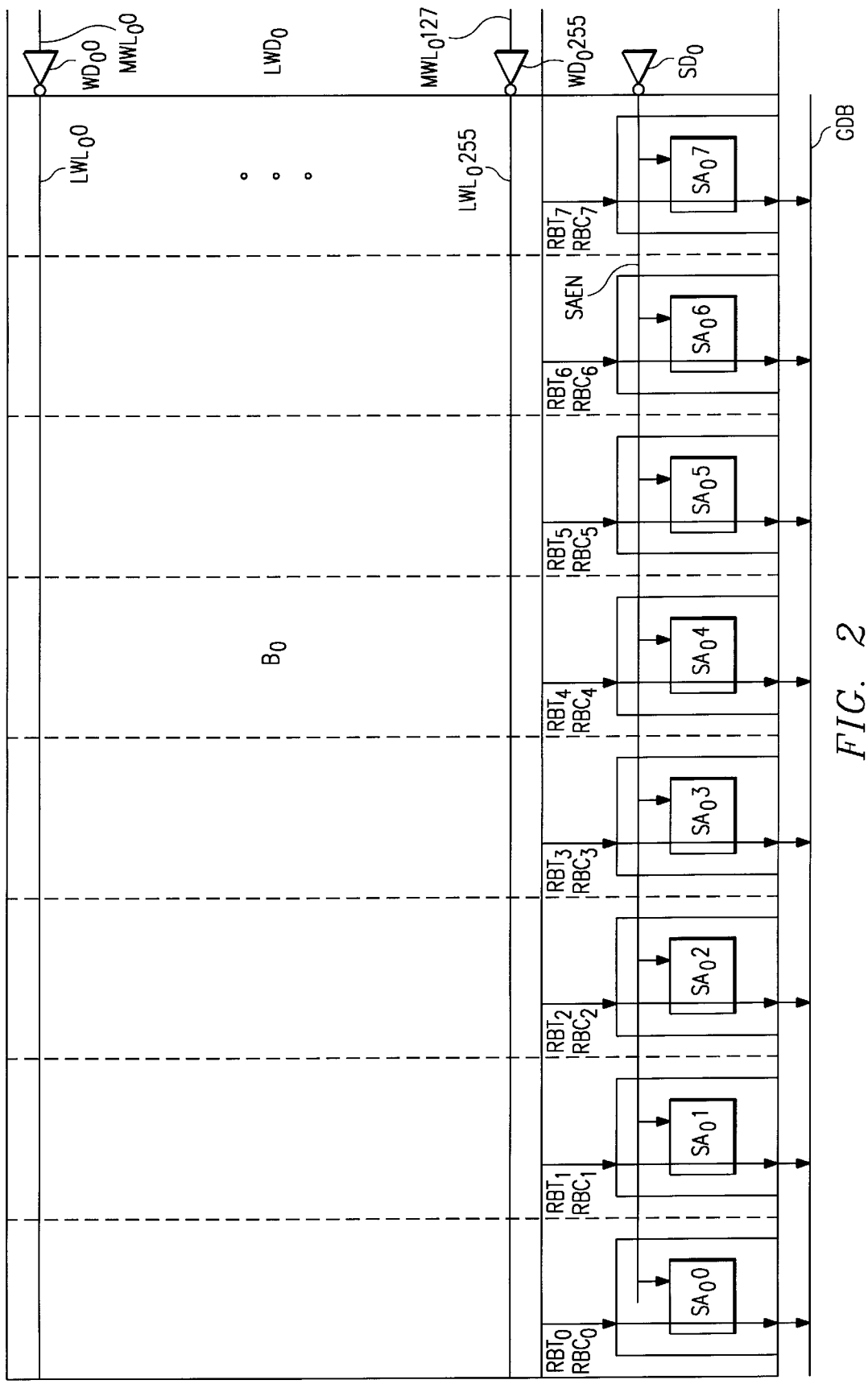
FIG. 2 is an electrical diagram, in block form, of a block in the integrated circuit memory of FIG. 1.

FIG. 2 shows a single memory block, $B_0$. In the preferred embodiment, each block has 256 rows, and 128 columns grouped into eight input/output groups. Each input/output group has sixteen adjacent primary columns of memory cells. Each input/output group also has a read circuit 600 containing a sense amplifier $SA_0, \ldots SA_7$ associated with it. A memory device having thirty-two blocks, as in the present example, has 256 input/output groups, 4096 columns, 8192 local wordlines, and 256 sense amplifiers.

Figure 3A:
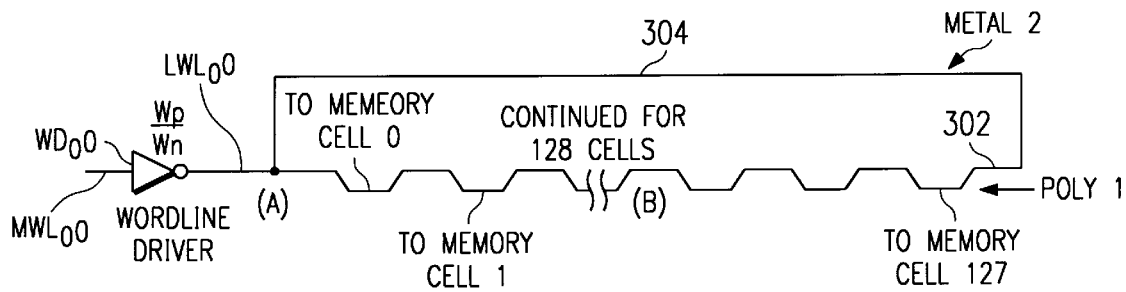
FIG. 3a is an electrical diagram, in schematic form, of the wordline and wordline driver.

The master wordlines are connected to the wordline drivers $WD_00 \ldots WD_0255$, to the local wordlines $LWL_00 \ldots LWL_0255$. Each local wordline is connected to every single memory cell in a row of memory cells. FIG. 3a shows a local wordline $LWL_00$ and a wordline driver $WD_00$.

The local wordline $LWL_00$ has a first conductive structure that allows it to connect to the memory cells. In the preferred embodiment the first conductive structure has two conductors, the first conductor is a polycrystalline silicon (hereinafter polysilicon) layer 302 and the second is a metal layer 304, although any conventional conductors can be used.

Figure 4:
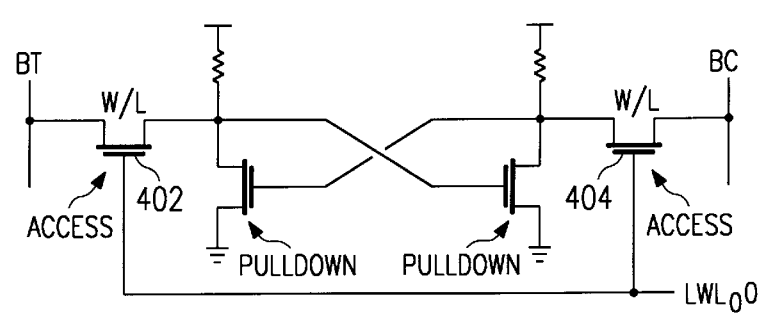
FIG. 4 is an electrical diagram, in schematic form, of a memory cell.

When the wordline driver $WD_00$ drives a signal on the local wordline $LWL_00$ the signal travels across the conductors to reach the memory cells. The conductor 302 has both a resistance and a capacitance due to both the natural resistance and conductance of the material and the load attached to the conductor. FIG. 4 shows the local wordline connected to a typical memory cell. First transistors 402, 404 are the load placed on the local wordline $LWL_00$. The number of first transistors for each local wordline is the number of transistors for each memory cell times the number of memory cells in each row, 128. In the preferred embodiment there are two first transistors 402, 404 for each memory cell, making the number of first transistors for each local wordline 256.

Referring again to FIG. 3a, due to the resistance and capacitance of and on the first conductor 302 the memory cell closest to the wordline driver $WD_00$, i.e. the inner memory cell, receives the signal before the subsequent memory cell. This can cause a significant delay between the inner memory cell and a memory cell at the outer end of the local wordline $LWL_00$ if the second conductor 304 was not shorted across the first conductor 302. To ease this problem the second conductor 304 is shorted across the first conductor 302. Now a signal will travel across both conductor to reach the memory cell, and the outer memory cell will receive the signal shortly after the inner memory cell. The resistance of the second conductor 304 is much lower than the resistance of the first conductor 302, so the delay based on the resistance of the second conductor 304 in reaching the outermost memory cell will be small. The memory cells toward the middle of the local wordline $LWL_00$ will still receive the signal after the memory cells at the ends receive it. However, since the distance from the wordline driver to the middle of the wordline is half of the distance to the outer end, the signal will get to the middle in a quarter of the time it would have taken it to travel to the end if the second conductor was not there, because both cutting the distance in half cuts both the resistance and capacitance in half. This results in cutting the longest of the delays by four.

Figure 5:
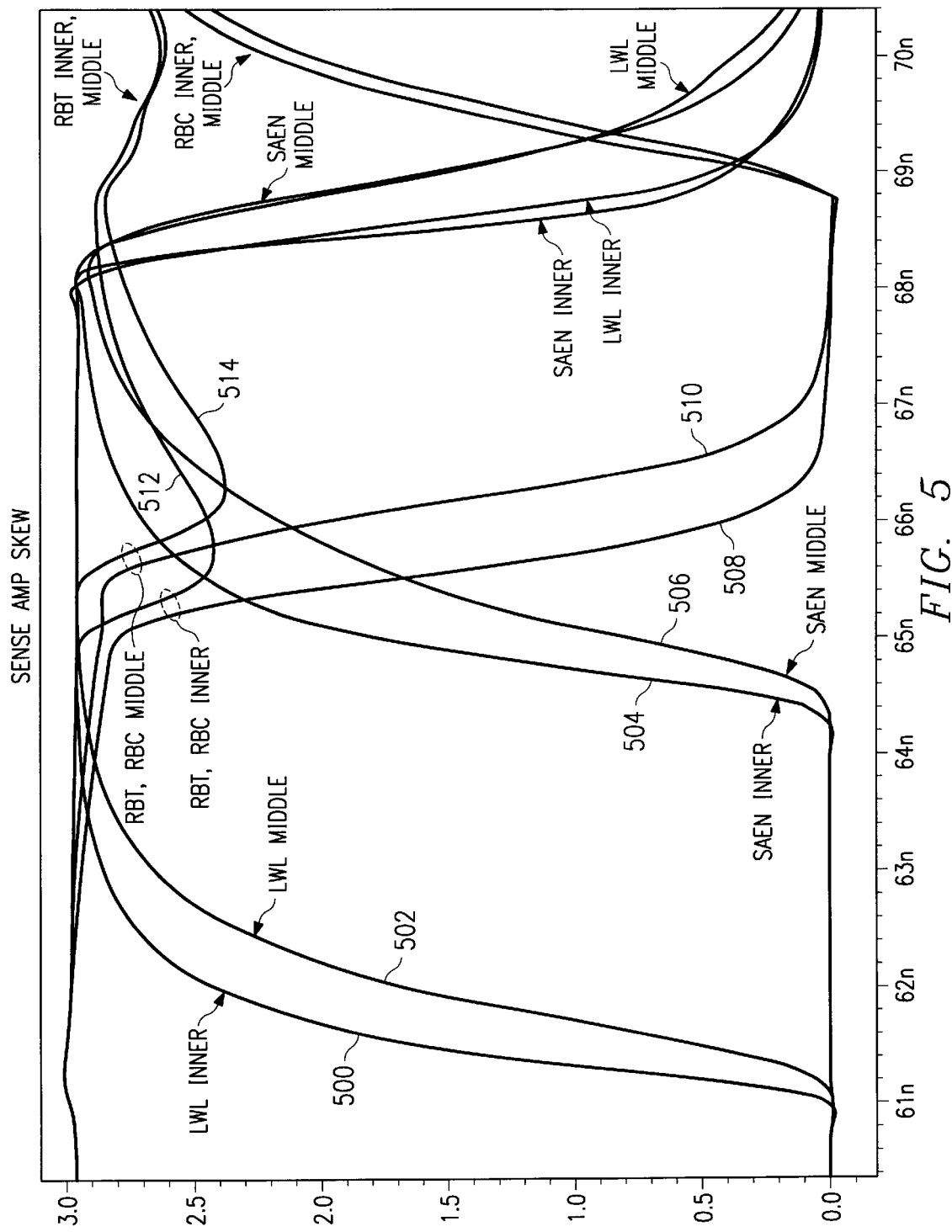
FIG. 5 is a timing diagram illustrating the operation of the local wordline.

However, there is still a delay between the signal reaching the inner or outer memory cell and memory cells between them. FIG. 5 shows the signal 500 on the local wordline when accessing the inner memory cell and the signal 502 on the local wordline when accessing the middle memory cell. Furthermore this delay increases as the signal progresses from the ends to the center of the local wordline $LWL_00$.

Referring again to FIG. 2, when the data in a memory cells attached to a local wordline $LWL_00$ needs to be read out a first signal is generated on the wordline driver $WD_00$ accessing the memory cell. The data in the memory cell is put on the read busses (true and compliment) associated with the input/output group of the memory cell, eg. $RBT_0$, $RBC_0$. A second signal is generated on the sense amplifier driver $SD_0$ and driven on the sense amplifier enable line SAEN, which enables the sense amplifiers $SA_00$ . . . $SA_07$. The second signal is generated after a sufficient time has elapsed to ensure that an adequate signal has developed on the read busses. If the sense amplifier $SA_00$ associated with the memory cell being read is not enabled at the proper time the sense amplifier may not sense the amount of signal and the data conducted to the global data bus can be wrong, producing the wrong data at the output.

To ensure that the data conducted to the output is correct the sense amplifier $SA_00$ associated with the memory cell being read is enabled after a first delay period after the memory cell is accessed. If the sense amplifier is enabled too early the sense amplifier will conduct erroneous data. If the sense amplifier is enabled too late there is a delay in how fast all of the data can be accessed. This increases the read cycle time of the memory device, thus decreasing its speed.

For each sense amplifier to be enabled after the same first delay period a memory cell associated with it is accessed the sense amplifier enable line SAEN has the same resistance and capacitance as the local wordline $LWL_00$. In the preferred embodiment of the invention, the sense amplifier enable line SAEN is made out of the same material that the local wordline $LWL_00$ is made of, to give the sense amplifier enable line SAEN the same resistance as the local wordline $MWL_00$. The layout and geometric configuration of the sense amplifier enable line SAEN is also made the same as that of the local wordline. In the preferred embodiment the local wordlines snake around other contacts on the memory device to optimize space, so the sense amplifier enable line SAEN is made to do the same.

Figure 3B:
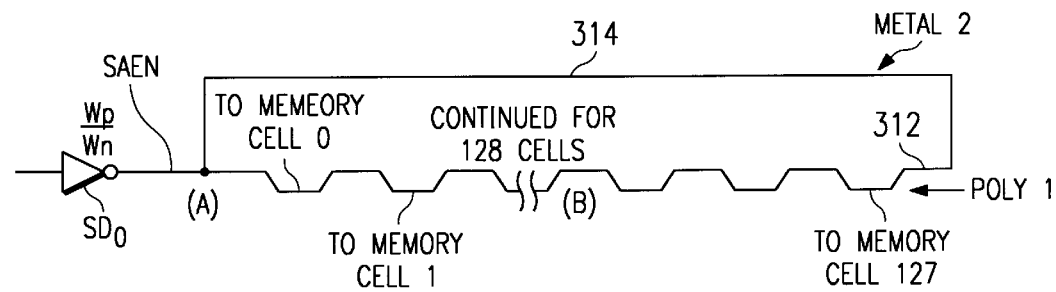
FIG. 3b is an electrical diagram, in schematic form, of the sense amplifier enable line and sense amplifier driver.

Referring to FIG. 3a and FIG. 3b simultaneously, in the preferred embodiment the sense amplifier enable line SAEN and the local wordline $LWL_00$ have a polysilicon first conductor 302, 312 that connects to the memory cells and a second conductor 304, 314 that shorts across the first conductor. The size of the sense amplifier driver is also the same size, and has the same composition as the wordline driver $WD_00$ to make the delay characteristics of the local wordline $MWL_00$ and sense amplifier enable line SAEN the same. Typically a local wordline is surrounded by conductors, in the metal layer above, below, and adjacent to the local wordline. To further insure that the delay characteristics are the same, the same conductors can be added in the same configuration in which they surround the local wordline to surround the sense amplifier enable line SAEN. Several sense amplifier enable line load circuit are added to the sense amplifier enable line SAEN to make the capacitance of the sense amplifier enable line SAEN and equal to the capacitance of the local wordlines.

FIG. 6 shows the read circuit 600 having a first read input coupled to a read bus true line $RBT_0$, and a second read input coupled to a read bus complement line $RBC_0$, the two bus lines are amplified through the sense amplifier 602, which is also in the read circuit 600, and are coupled to the global data bus driver 606. The read bus true $RBT_0$ and read bus complement $RBC_0$ are coupled through an input/output multiplexer circuit to the memory cells in the array $B_0$. The equilibrate circuit 604 precharges the sense amplifier 602 during the write mode. During a write, sense amplifier equilibrate complement line SAEQbC, which is the input of the equilibrate circuit 604, is low turning on all of the transistors in equilibrate circuit 602 thus precharging the sense amplifier 602 through them. During a read, sense amplifier equilibrate complement line SAEQbC is high turning off all of the transistors in equilibrate circuit 604 not allowing the power supply voltage to pass to the sense amplifier 602. A preferred embodiment of the equilibrate circuit 604 is described in detail in U.S. Pat. No. 5,619,466 "Low-Power Read Circuit and Method for Controlling a Sense Amplifier," although any equilibrate circuit may be used.

Read circuit 600 also contains the sense amplifier enable line operational circuit 608 and the sense amplifier enable line load circuit 612. Sense amplifier enable line operational circuit 608 contains the additional circuitry of the read circuit 600 needed for its proper operation, such as inverter 626 and enable circuit 624 through which sense amplifier enable line SAEN enables the sense amplifier 602. The sense amplifier enable line operational circuit 608 is made up of a plurality of second transistors, each one of which has a gate coupled to the sense amplifier enable line SAEN. Each of the logic elements shown in the sense amplifier enable line operational circuit is typically formed by a particular combination of transistors.

To make the capacitance of the sense amplifier enable line SAEN equal to the capacitance of the local wordlines the sense amplifier enable line SAEN has the same total transistor length and width that is driven by it as is driven by the local wordline. One way to do this is by driving the same number of the same size transistors by the sense amplifier enable line SAEN as are driven by the wordline. Since the transistors on the local wordline are spread out throughout the local wordline, the transistors on the sense amplifier enable line SAEN should also be spread out throughout the sense amplifier enable line SAEN. There are already second transistors added in each read circuit, and since the read circuits are spread out throughout the sense amplifier enable line SAEN, as shown in FIG. 2, the second transistors are also spread throughout the sense amplifier enable line SAEN.

Referring to FIG. 6, the additional transistors needed to make the load on the sense amplifier enable line SAEN equal to the load on the local wordline are provided in a sense amplifier enable line load circuit 612. To spread the transistors, and therefore the load, throughout the sense amplifier enable line SAEN there is one sense amplifier enable line load circuit 612 in each of the read circuits 600. The sense amplifier enable line load circuit 612 has a plurality of third transistors 610, each having its gate coupled to the sense amplifier enable line SAEN. The third transistor total area (its length by width dimensions) in each sense amplifier enable line load circuit 612 is equal to the total first transistor area divided by the number of said sense amplifier enable line load circuits, which is eight in the present example, less the total second transistor area. (total area of third transistors in sense amplifier enable line each load circuit=(total area of first transistors /# of sense amplifier enable line load circuits)−total area of second transistors in each sense amplifier enable line operational circuit.) This can be done by making the number of third transistors in each sense amplifier enable line load circuit 612 equal to the number of first transistors divided by the number of said sense amplifier enable line load circuits, which is eight in the present example, less the number of second transistors of all equal size transistors. (# of third transistors in each sense amplifier enable line load circuit=(# of first transistors /# of sense amplifier enable line load circuits)−# of second transistors in each sense amplifier enable line operational circuits.) In the present example the number of third transistors in each sense amplifier enable line load circuit 612 is sixteen. The sixteen third transistors are coupled in parallel with their gates coupled to the sense amplifier enable line SAEN. The source and drain of each of the third transistors is coupled to ground, to not draw additional current, therefore not using any additional power.

Although the present invention can be used with any sense amplifier, it is particularly advantageous when used with a dynamic clocked sense amplifier 602, such as the one shown in FIG. 6. The sense amplifier is composed of two p-channel and 2 n-channel transistors 616, 618, 620, 624, respectively, cross-coupled as shown. An enable circuit 624 having switching transistor 625 is coupled between the transistors 620, 622 and ground.

During a read, a first signal is sent on the local wordline associated with the memory cells containing the data by the wordline driver. This access the memory cells and the data in the memory cells is placed on the read buses $RBT_0$, $RBC_0$. A first delay time after the first signal is sent a second signal is sent on the sense amplifier enable line by the sense amplifier driver. When the second signal reaches the sense amplifier a first delay time after the first signal reached the memory cells. This is enough time for the signal on the read buses $RBT_0$, $RBC_0$ to build up at the connections of transistors 618 and 620, and 616 and 622 respectively. When the second signal reaches the sense amplifier it turns on transistor 625 in the enable circuit 624, latching the data state on the busses $RBT_0$, $RBC_0$. If the tracking on the sense amplifier enable line SAEN was not accurate the sense amplifier 602 can latch before the enough signal builds up on the read buses, thus latching the wrong data state.

Therefore the invention provides an advantage by allowing tracking of a first signal generated on a local wordline by a wordline driver by second signal generated by a sense amplifier driver enables. Because this tracking is tied to the material, size, shape, and load of the sense amplifier enable line and local wordline it will not be affected if the memory device is manufactured in a different process. Thus, this invention allows the tracking of the two signals through variations in the critical dimensions of the components of the memory device, variations in sheet resistance, and any process variations. As long as the sense amplifier enable line is made the same as the local wordline, the changes will not affect the tracking.

The tracking of the wordline by the sense amplifier enable line prevents the possible delivery of erroneous data to the user due to the early enabling of the sense amplifier, and the delay to the entire read cycle caused by a late enabling of the sense amplifier. The tracking of the wordline by the sense amplifier enable line can be seen in FIG. 5. The delay between when the signal traveling on the local wordline reaching the first memory cell that can be accessed, shown as 500, and the last memory cell that can be accessed, shown as 502 is the same as the delay between the signal traveling on the sense amplifier enable line reaching the sense amplifier associated with the first memory cell, shown as 504, and the sense amplifier associated with the last memory cell, shown as 506. Because the read buses also pass through the sense amplifier, there is also a delay between the signal on the read buses associated with the first memory cell that can be accessed, shown as 508, 512, and the signal on the read buses associated with the last memory cell that can be accessed, shown as 510, 514.

While the invention has been specifically described with reference to a preferred embodiment, it will be understood by those of ordinary skill in the prior art having reference to the current specification and drawings that various modifications may be made and various alternatives are possible therein without departing from the spirit and scope of the invention.

For example:

While the first conductor is described as polysilicon any conductor can be used.

Although the invention is described in relation to SRAMs the invention can be used in other types of memories having memory arrays including redundant columns, including read-only memories, FIFOs, DRAMs, EPROMs, EEPROMs, and microprocessors and other devices which have embedded memories without departing from the scope of the invention.

I claim:

1. A method of reading data from one or more memory cells in an integrated circuit memory device with a plurality of memory cells arranged in rows and columns, wherein said rows and columns of said primary memory cells are grouped into at least one block, each block having a plurality of local wordlines each coupled to a wordline driver, one or more read circuits each having a sense amplifier coupled to a sense amplifier driver, and a sense amplifier enable line, comprising:

generating a first signal on the wordline driver;

after a first delay generating a second signal on the sense amplifier driver;

receiving said first signal at a memory cell;

receiving said second signal at a sense amplifier associated with said memory cell after approximately said first delay.

2. The method of claim 1, wherein said sense amplifier enable line has a resistance approximately equal to a resistance of one of said local wordlines and a capacitance approximately equal to a capacitance of one of said local wordlines.

3. The method of claim 1, wherein said sense amplifier enable line has the same layout as one of said local wordlines.

4. The method of claim 1, wherein said sense amplifier includes a pair of cross-coupled transistors, with a first transistor of said pair having a conduction path coupled between said read bus true line and an enabling circuit and a second transistor of said pair having a conduction path coupled between said read bus complement line and said enabling circuit for latching the data states on said read bus true line and read bus complement line.

5. The method of claim 4, wherein said enabling circuit comprises an enabling transistor having a gate coupled to said sense amplifier enable line.

6. The method of claim 1, wherein said sense amplifier enable line has the same conductors above, below, and adjacent as one of said local wordlines.

7. The method of claim 1, further comprising a said sense amplifier driver having the same dimensions and comprised of the same material as one of said local wordlines.

8. The method of claim 1, wherein:

each one of said plurality of local wordline has a first conductive structure; and said sense amplifier enable line has said first conductive structure.

9. The method of claim 1, further comprising one or more sense amplifier enable line load circuit, each coupled to said sense amplifier enable line.

10. The method of claim 9, further comprising one or more sense amplifier enable line operational circuits, each coupled to said sense amplifier enable line, and each having a plurality of second transistors with a gate coupled to said sense amplifier enable line.

11. The method of claim 10, wherein:

each one of said local wordlines coupled to a gate of a plurality of first transistors; and each said sense amplifier enable line load circuit has one or more third transistors, Wherein the number of third transistors in each sense amplifier enable line load circuit is equal to the number of said first transistors divided by the number of said sense amplifier enable line load circuits less the number of said second transistors.

12. The method of claim 11, wherein each of said third transistors is coupled in parallel with each other third transistor, having a gate coupled to said sense amplifier enable line, and having a source and a drain coupled to ground.

* * * * *